United States Patent
McGuire (10) Patent No.: US 6,700,513 B2
(45) Date of Patent: Mar. 2, 2004

(54) METHOD AND SYSTEM FOR COMPRESSING AND DECOMPRESSING MULTIPLE INDEPENDENT BLOCKS

(75) Inventor: Thomas Dee McGuire, Woodinville, WA (US)

(73) Assignee: Microsoft Corporation, Redmond, WA (US)

( * ) Notice: Subject to any disclaimer, the term of this patent is extended or adjusted under 35 U.S.C. 154(b) by 3 days.

(21) Appl. No.: 10/146,254

(22) Filed: May 14, 2002

(65) Prior Publication Data

US 2003/0218554 A1 Nov. 27, 2003

(51) Int. Cl.[7] .............................................. H03M 7/00
(52) U.S. Cl. .................... 341/107; 341/65; 341/106; 341/63
(58) Field of Search ........................ 341/107, 65, 51, 341/52, 63, 60, 50, 106; 707/101; 380/217, 37, 269

(56) References Cited

U.S. PATENT DOCUMENTS

| | | | | |
|---|---|---|---|---|
| 5,394,534 A | * | 2/1995 | Kulakowski et al. | ....... 711/112 |
| 5,572,206 A | * | 11/1996 | Miller et al. | ................... 341/51 |
| 5,710,562 A | * | 1/1998 | Gormish et al. | ............. 341/107 |
| 5,945,933 A | * | 8/1999 | Kalkstein | ..................... 341/63 |
| 6,075,470 A | * | 6/2000 | Little et al. | ................... 341/107 |
| 6,122,378 A | * | 9/2000 | Yoshiura et al. | ............. 380/217 |
| 6,285,458 B1 | * | 9/2001 | Yada | ......................... 358/1.15 |
| 6,317,747 B1 | * | 11/2001 | Bolan et al. | ................. 707/101 |
| 6,411,714 B1 | * | 6/2002 | Yoshiura et al. | ............. 380/269 |
| 6,504,931 B1 | * | 1/2003 | Yoshiura et al. | .............. 380/37 |
| 2001/0031092 A1 | * | 10/2001 | Zeck et al. | .................. 382/239 |

* cited by examiner

Primary Examiner—Brian Young
Assistant Examiner—John Nguyen
(74) Attorney, Agent, or Firm—Merchant & Gould P.C.

(57) ABSTRACT

A system and method that provides a unique or custom context for a plurality of blocks of data, yet compresses the blocks independently from the others, such that each block is independently decompressible. The method analyzes a collection of blocks for compression, and computes a unique context, such as a Huffman tree, given the distribution of symbols or phrases across all the blocks in the collection. Each block in the collection can be independently decompressed, in any order, using the shared context that is common to the collection.

19 Claims, 6 Drawing Sheets

METHOD AND SYSTEM FOR COMPRESSING AND DECOMPRESSING MULTIPLE INDEPENDENT BLOCKS

FIELD OF THE INVENTION

The present invention relates to the compression of computer data readable by a computer system, and in particular methods of compressing a collection of data blocks that are predefined, relatively independent portions of data. More particularly still, the present invention relates to compressing a collection of data blocks such that the blocks remain independently decompressible, i.e., randomly accessible, while utilizing similarities among the collection of data blocks to achieve better compression.

BACKGROUND OF THE INVENTION

In many distributed environments, many data files, and hence significant amounts of data, are regularly transferred between different computer systems. In general, some transfer connections are faster than others, but it is well known that it takes less time to transfer smaller portions, blocks or files of data than larger ones. For this reason and others, many efforts have been made to reduce file sizes, such as through the use of compression techniques.

Compression relates to the conversion of one set or string of data to another, smaller set or string of data. Importantly however, the second, shorter set of data represents the same content as the first, longer set such that the shorter string may be generally "decompressed" back into the original string. Typical compression algorithms capitalize on redundancy to compress data. In essence, these algorithms replace redundant or often occurring phrases or portions of data with other, shorter versions. In order to accommodate such replacements, some portions of data that are not used often may be replaced with somewhat longer versions of data. However, this tradeoff is acceptable in many scenarios due to the overall or net size savings in reducing redundancy.

One common technique in compressing data relates to the use of Huffman coding. Huffman coding requires an analysis of data to determine probabilities of redundancy for the data. Upon determining relative probabilities for the data, variable length codes may be assigned to the various data phrases. Often, the variable length code assignments may be represented in the form of a "context," which, in this case, the context is a Huffman tree. Contexts essentially provide a decompressor with the necessary information to decode, or decompress a compressed stream. Huffman trees and other variable-length contexts may be used in combination with other compression methods as well, such as "LZ-77" compression techniques, where literals and pointers may be assigned variable length codes as dictated by the context or Huffman tree.

In operation, there are essentially two ways in which contexts are used. One method relates to the creation of a generic, or stock context that may be used with all sets of data. For instance, a stock, English-alphabet context may be created which assigns variable length codes to letters of the alphabet based on a generic cross-sectional analysis of various documents. Such an analysis may provide short codes to letters "e" and "a" while assigning longer codes to letters "z" and "q" since the former symbols tend to occur more often than the latter symbols. These stock contexts may then be incorporated into a decompressor module and used to decompress any document having English letters. A small identifier sequence may be provided with the compressed data indicating that the data is in English such that the decompressor recognizes which stock context to use. One benefit to the stock context is that only a small portion of code is attached to the compressed code itself such that little overhead is lost in providing information to the decompressor about the type of context, e.g., which Huffman tree to use in decompressing the data. Further, since the decompressor is familiar with the stock context no time or space is lost in communicating either the context itself or how to use the context to the decompressor.

Unfortunately however, one drawback in using stock contexts or Huffman trees relates to the fact that each stock context is based on a generic analysis of many different documents or streams of data. These other documents are typically significantly different from the actual document being compressed and decompressed using the stock context. Consequently, the actual compression ratio is far from optimal, i.e., the resulting compressed data stream is actually larger than it needs to be, and often, the resulting compressed data stream is unsatisfactorily large.

One solution to the problems associated with using stock contexts or Huffman trees relates to using customized contexts for each stream of data being compressed. Customized contexts are created by a method that analyzes the actual data stream or document to be compressed and determines the best use of variable length codes to provide the smallest compressed stream of data for that data stream. For instance, a document written in the English language may frequently use the letter "z" and infrequently use the letter "a" such that the customized context, e.g., Huffman tree may assign a relatively small code to the letter "z" and relatively large code to the letter "a." In such a case, the resulting compressed stream would be smaller than if the stock context described above was used.

Unfortunately however, customized contexts suffer some drawbacks as well. In particular, when a customized context is created and used, the context itself must be transferred to the decompressor. Typically, the context is appended to the front or back of the compressed stream of data. Attaching the context in this manner increases the overall size of the data to be transmitted, which may increase transmission time. This phenomenon is particularly important when the original stream of data is relatively small. In such a case, the combination of a customized context and the compressed data stream may actually be larger than the original data stream. Stated another way, the compression ratio, where the compression ratio equals the size of the output data stream divided by the size of the input data stream, may be greater than 1 when the customized context is appended to an output data stream for a relatively small input data stream.

Typically, when compressing many smaller blocks of data, concatenating the smaller blocks or objects and compressing them as one decreases the compression ratio. Although compressing the blocks as a single unit decreases the compression ratio, this technique suffers a significant drawback. In particular, in order to access a single one of the blocks of data, the entire concatenated set of blocks must be decompressed. Hence, compression, transfer and decompression time may take too long. Stated another way, there is no way to randomly access a block. For instance, if the eleventh block is needed, the first ten blocks must be decompressed before accessing the eleventh block. This situation is particularly true when the compression algorithm uses an LZ-77-type technique involving interleaved pointers and literals, where the pointers point to redundant elements located in the separate blocks. Consequently, all blocks must be decompressed prior to accessing any one block, i.e., there is no random accessibility.

It is with respect to these and other considerations that the present invention has been made.

SUMMARY OF THE INVENTION

The present invention relates to a system and method that provides a unique or custom context for a plurality of blocks of data, yet compresses the blocks independently from the others, such that each block is independently decompressible. The method analyzes a collection of blocks for compression, and computes a unique context, such as a Huffman tree given the distribution of symbols or phrases across all the blocks in the collection. The unique context is used to decompress the blocks and may be referred to as a "shared decompression context." Consequently, rather than the decompressor having a fixed or known stock context for all blocks, the collection-specific, shared decompression context is included in an initial transfer and this shared decompression context is used to decompress the blocks. Each block in the collection can be independently decompressed, in any order, using the shared decompression context. Providing a context based in part on the specific symbol-distribution characteristics of each block improves compression ratios over the use of a single, global, stock context because the context codes are computed across a distribution of symbols unique to a particular collection, not a generic cross-section. Additionally, creating a shared context is generally more efficient than computing and encoding a separate context for each independent block, especially when the blocks are relatively small.

The present invention involves any data compressor where a collection of blocks needs to be independently decompressible, i.e., decompressible in any order which is often referred to as providing "random access." The blocks of the collection share some commonality in their composition such that a common decompression context, whether using Huffman trees or some other coding provides useful compression characteristics. Therefore, in accordance with certain aspects, the present invention may be implemented using Huffman coding with or without LZ-77 compression methods. Alternatively, the present invention may use other coding techniques.

In accordance with certain aspects, the present invention relates to a system and method that compresses a plurality of blocks of data, wherein the blocks are first analyzed to determine unique characteristics of the set of blocks. For instance, the blocks are evaluated based on symbol distribution and probabilities of occurrence, e.g., using variable-size coding such as Huffman coding and/or LZ-77 type analysis using literals and pointers. Upon completion of the analysis phase, a shared context is dynamically created for the plurality of blocks. Next, each block is compressed in a manner such that each compressed representation of a block, i.e., each compressed block, can be decompressed independently of the other blocks. The blocks may be combined into a collection and the shared context would therefore be associated with the blocks of the collection. The shared context is generally separable and independently transferable from the blocks.

In accordance with other aspects, the present invention relates to a system and method for decompressing compressed blocks of data wherein the compressed blocks of data are associated with one or more other blocks of data in a set or collection of data blocks. Besides accessing the one or more blocks, a shared context is also accessed, wherein the shared context has decompression information for the one or more blocks of compressed data as well as one or more other associated blocks of data. The one or more blocks of compressed data are then decompressed. However, not all of the associated blocks that relate to the same shared context need to be decompressed to decompress any one block of data. The decompression may occur on client computer system, remote from a server computer system and the shared context may be transferred to the client computer system independently of the blocks of data.

In accordance with other aspects, the present invention relates to a computer system having a compression module for compressing a set uncompressed data blocks. The compression module has an analysis module that analyzes the blocks for compression characteristics and dynamically creates a shared context. The compression module further has a build module for compressing the blocks using the shared context. The computer system may further have a receive module for receiving the uncompressed data and a send module for sending information to a second computer system. The send module sends either the whole shared context or just a shared decompression context to the second computer system and may also send one of the compressed blocks of a data to the second computer system for decompression. In an embodiment, the second computer system decompresses at least one block of compressed data independently of the other blocks in the collection.

The invention may be implemented as a computer process, a computing system or as an article of manufacture such as a computer program product. The computer program product may be a computer storage medium readable by a computer system and encoding a computer program of instructions for executing a computer process. The computer program product may also be a propagated signal on a carrier readable by a computing system and encoding a computer program of instructions for executing a computer process.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION

Figure 1:
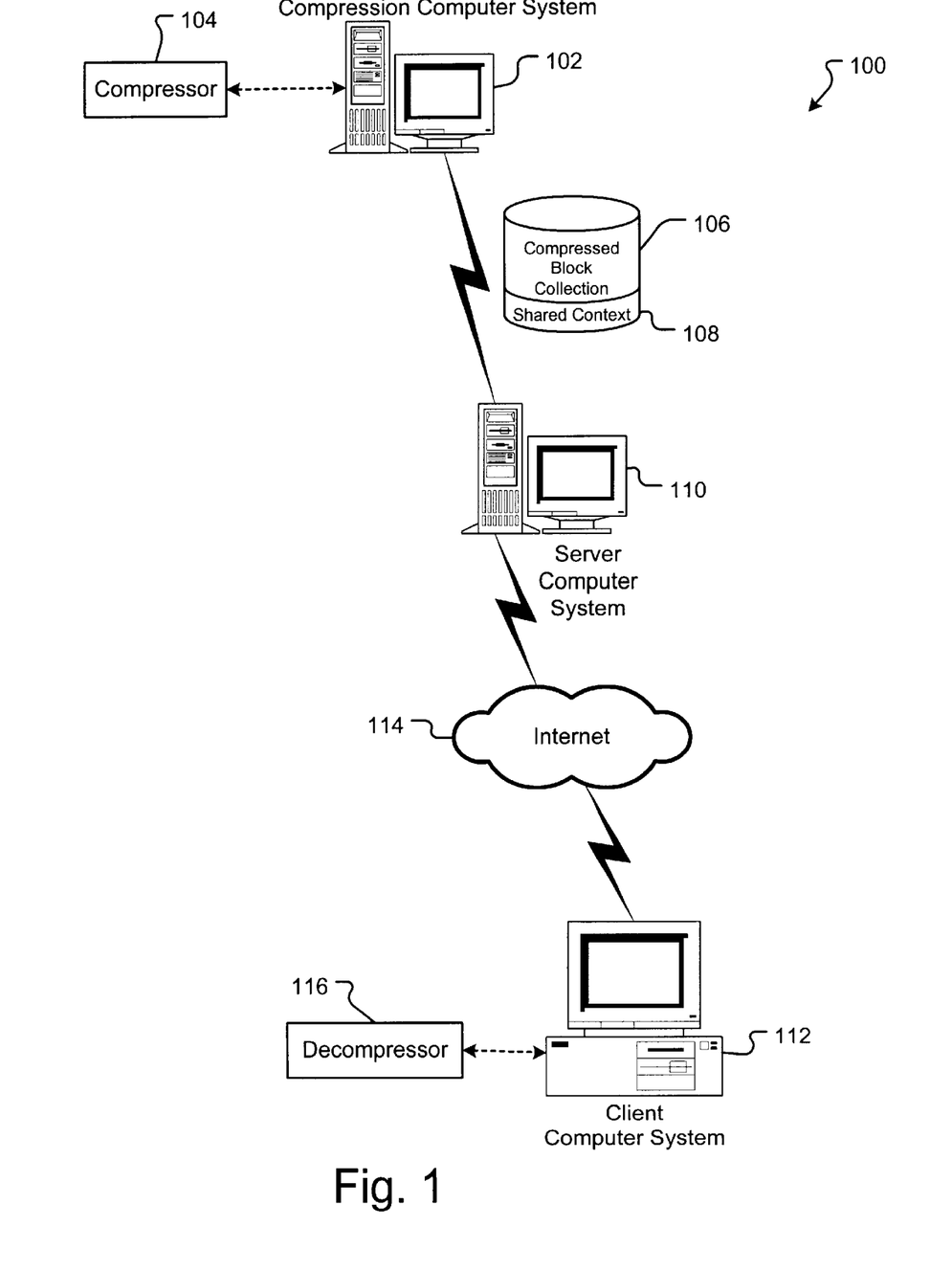
FIG. 1 illustrates a communication or distributed network having a server computer system and a client computer system according to aspects of the present invention.

A distributed environment 100 incorporating aspects of the present invention is shown in FIG. 1. The environment 100 has a compression computer system that includes a compressor module 104 for compressing one or more streams of data. In an embodiment, the streams of data compressed by compressor module 104 are blocks (not shown) associated in a collection. The compressor 104 produces a compressed block collection 106 having a shared context 108. The compressed block collection 106 has two or more independently decompressible blocks or objects. The shared context 108 is the unique Huffman code or other encoding information used in both compressing and decompressing the blocks in the collection 106.

The environment 100 also has a server computer system 110 that stores compressed streams of data, such as the compressed block collection 106. The server computer system 110 communicates with a client computer system 112 through a communications connection, such as through the Internet 114. The client computer system 112 receives compressed blocks from the server computer system 110. The client computer system 112 has a decompressor module 116 that is used to decompress the compressed blocks. Additionally, the client computer system 112 receives the shared context 108 and uses the shared context 108 to decompress the blocks. Since the shared context 108 comprises both compression information and decompression information, the shared context 108 may be reduced in some embodiments to a "shared decompression context" which has less information than the entire shared context. The shared decompression context may be sent to the client computer system 112 and used to decompress the compressed data. Of course, alternative embodiments may send the entire shared context to the client computer system 112 for decompression purposes.

In an embodiment of the invention, the computer system 112 is a small computer device such as a handheld computer system, having a reduced memory capacity such that all blocks in collection 106 are not received or decompressed at the same time. Indeed, in an embodiment of the invention, the client computer system only receives one block in collection 106 and decompresses the block using shared context 108 independently of the other blocks in the collection 106.

Figure 2:
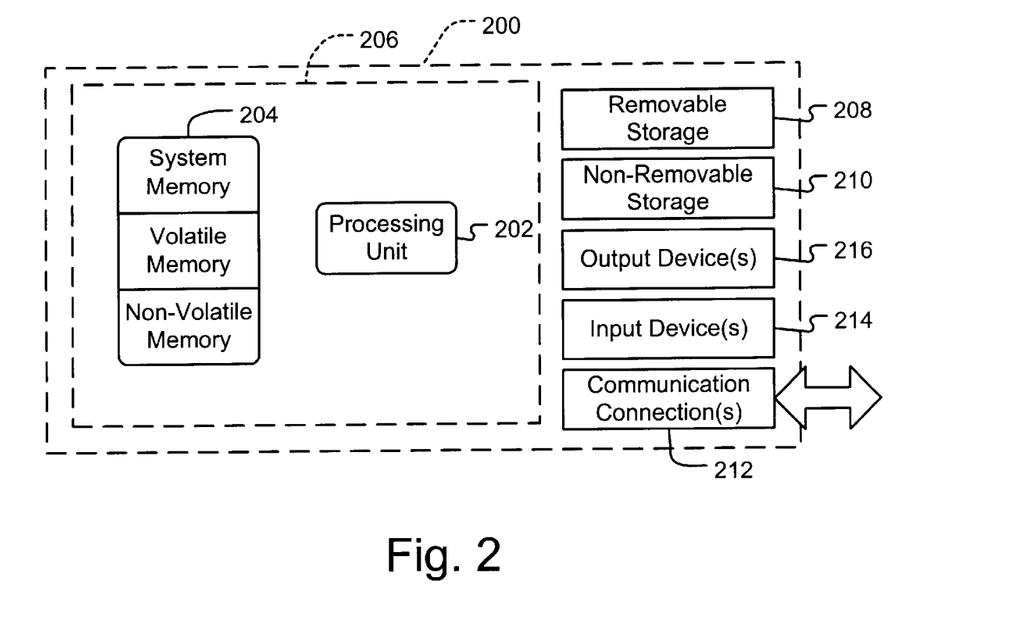
FIG. 2 illustrates a computer system, such as the server computer system or client computer system shown in FIG. 1, which may be used according to particular aspects of the present invention.

The computer systems 102, 110 and 112 may be represented by the computer system 200 shown in FIG. 2. The system 200 has at least one processor 202 and a memory 204. In one embodiment the processor 202 compresses streams of data, i.e., blocks, according to aspects of the present invention. In another embodiment of the invention, the processor 202 uses memory 204 to store compressed blocks that has been compressed according to the present invention. In yet another embodiment, the processor 202 decompresses the compressed blocks.

In its most basic configuration, computing system 200 is illustrated in FIG. 2 by dashed line 206 encompassing the processor 202 and the memory 204. Additionally, system 200 may also include additional storage (removable and/or non-removable) including, but not limited to, magnetic or optical disks or tape. Such additional storage is illustrated in FIG. 2 by removable storage 208 and non-removable storage 210. Computer storage media, such as memory 204, removable storage 208 or non-removable storage 210 includes volatile and nonvolatile, removable and non-removable media implemented in any method or technology for storage of information such as computer readable instructions, data structures, program modules or other data. Memory 204, removable storage 208 and non-removable storage 210 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by system 200. Any such computer storage media may be part of system 200. Depending on the configuration and type of computing device, memory 204 may be volatile, non-volatile or some combination of the two.

System 200 may also contain communications connection(s) 212 that allow the device to communicate with other devices. Additionally, system 200 may have input device(s) 214 such as keyboard, mouse, pen, voice input device, touch input device, etc. Output device(s) 216 such as a display, speakers, printer, etc. may also be included. All these devices are well known in the art and need not be discussed at length here.

Computer system 200 typically includes at least some form of computer readable media. Computer readable media can be any available media that can be accessed by system 200. By way of example, and not limitation, computer readable media may comprise computer storage media and communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

As stated, the computer systems 102, 110 and 112 may be represented by the computer system 200 shown in FIG. 2. The processing unit and memory in computer system 102 are used to compress blocks of data through the use of compressor module 104. The communications connection is used to transfer the compressed blocks to the computer system 110. In alternative embodiments, the computer system 102 compresses the blocks and stores the compressed collection 106 locally, and ultimately transfers the blocks directly to the client computer system 112, such that no intermediate transmission to the server computer system 110 takes place.

Figure 3:
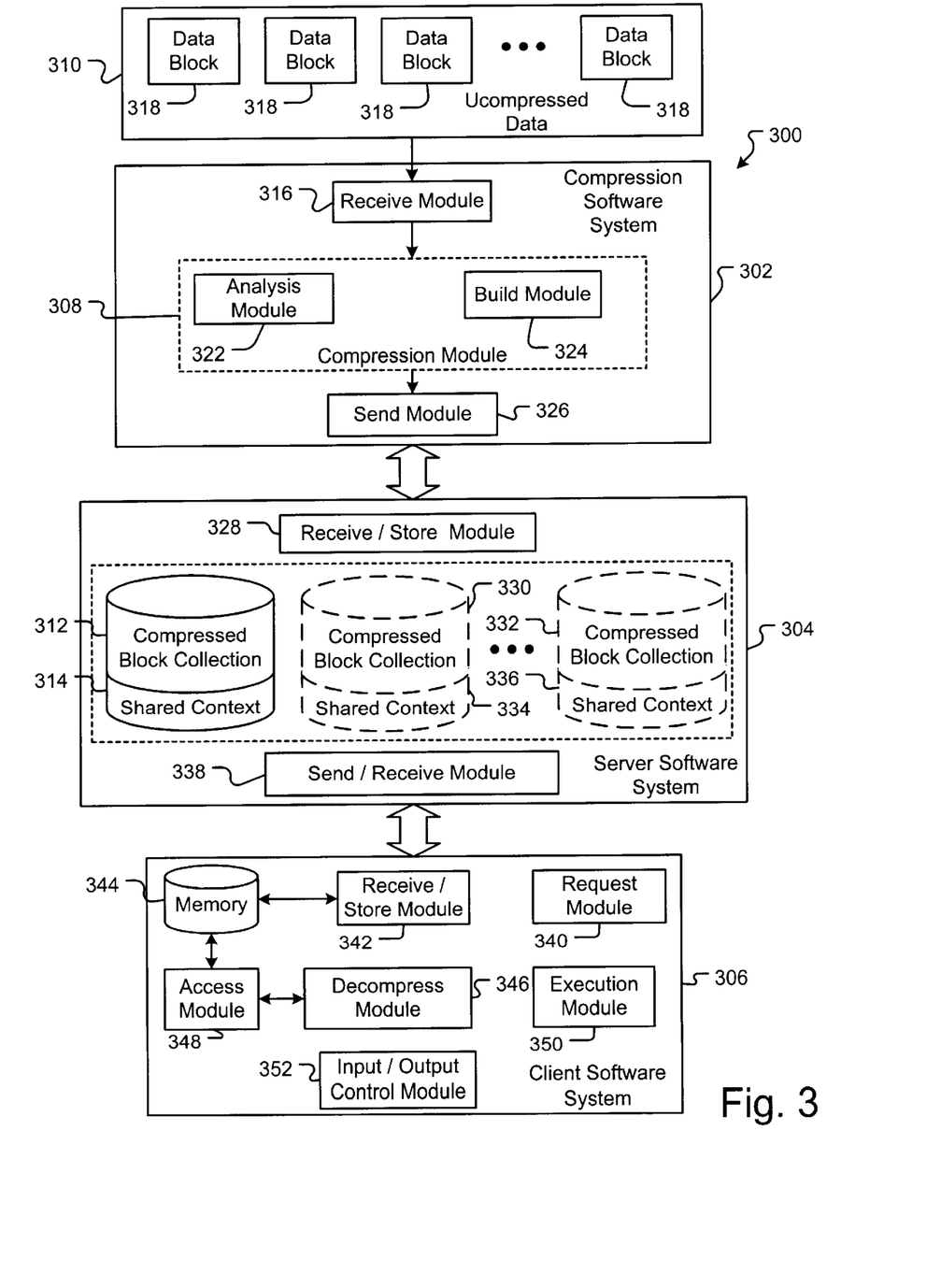
FIG. 3 illustrates a software environment in an embodiment of the present invention.

In accordance with aspects of the invention, a software environment 300 is shown in FIG. 3 wherein the environment has a compression software system 302 that is used to compress data. The compressed data is transmitted to a server software module 304, which stores the compressed data and later transfers the compressed data to a client software module 306 for decompression and use.

In operation, the compression software system 302 uses a compression module 308 to compress uncompressed data 310 into a compressed block collection 312 having a shared context 314 (shown in module 304). The system 302 may incorporate a receive module 316 for receiving the uncompressed data 310. The uncompressed data 310 may be transferred from any location to the compression system 302 or, in alternative embodiments, the data 310 may be resident on the same system as the compression system 302. The receive module 316 passes the uncompressed data 310 to the compression module 308.

In an embodiment, the compression module 308 receives the uncompressed data in the form of objects or blocks, such as blocks 318 shown in FIG. 3. In general, upper layers of software may be used to logically divide the uncompressed data into logical blocks 318. These blocks may have a logical relationship to one another, e.g., the uncompressed data 310 may be a binary form of an executable program and the blocks 318 may relate to subroutines that together form the executable file.

In general, the blocks 318 have been evaluated and associated with other blocks 318, thereby forming a set or collection of data blocks. The evaluation process, for example, may determine that a particular subroutine is only called by one other such subroutine. In such a case, the two subroutines may be associated with one another into a collection. In one embodiment, the collections are based on logical associations within an executable file. In another embodiment, the collections are based on compression characteristics, i.e., blocks that may be highly compressible with one another due to shared redundancy characteristics and therefore combined into a collection. In other embodiments, the blocks are combined based on other predetermined characteristics into collections.

Once combined into collections, a collection may then be provided to the compression module 308 of the compression software layer 302. Compression module 308 has an analysis module 322 analyzes the various blocks of a collection for redundant phrases or symbols and determines probabilities for the occurrence of these phrases. Based on this analysis, build module 324 builds a compressed block collection, such as compressed block collection 312. Additionally, the build module 324 builds or constructs a shared context for the compressed block collection, such as shared context 314. The shared context relates to the compression information indicating probability of occurrence or recurrence of symbols within the blocks of the collection. In one embodiment the shared context is a Huffman tree that assigns variable length codes to symbols within the blocks. In another embodiment, the shared context is a Huffman tree that assigns variable length codes to symbols, phrases, and/or pointers to other symbols or phrases. Other embodiments may use other coding algorithms to create the shared contexts. Further, the shared context 314 has decompression information, e.g., the Huffman tree. As used herein, the term "shared decompression context" refers to the necessary information used by a client software system, such as system 306, to independently decompress one or more compressed data blocks.

In an embodiment, the shared context is created with consideration to block boundaries. That is, the shared context is based on redundant patterns and symbol distribution analysis within each individual block, and not with respect to data spanning block boundaries. In order to maintain independent decompressibility, no pointers or associations are made across block boundaries, and therefore, the analysis of the data for redundant patterns honors these boundaries as well.

Once built, send module 326 sends the compressed block collection to the server software module 304. In the embodiment shown in FIG. 3, the send module 326 communicates with other computer systems, such as server computer system 110 (FIG. 1). As may be appreciated, the send module may supply the compressed collection to many different server computer systems. The different server computer systems may then be used to store information and communicate with the client computer systems, such as system 112 (FIG. 1).

The send module 326 typically communicates with a receive and store module 328 within the server software system 304. The receive and store module receives the compressed block collection, such as 312 and stores the collection in memory. In an embodiment, the receive module 328 requests the transfer of the collection from the compression module, yet in other embodiments, the transfer is relatively automatic. Additionally, the receive module 328 may receive and store a plurality of compressed block collections, such as collection 312, collection 330 and collection 332. In particular, when the uncompressed data relates to an executable that has been split into many different collections of blocks, receive module 328 may ultimately receive all the compressed block collections related to that executable file.

Each compressed block collection, such as collections 312, 330 and 332 has an associated shared context, such as contexts 314, 334 and 336, respectively. In essence, once a collection of blocks has been compressed according to its unique probability of redundancy, the resulting shared context for that collection becomes associated with the collection and is passed to the server software module 304 along with its associated compressed block collection.

Server software module 304 also has a send/receive module 338 which is used to communicate with client software module 306. The send receive module receives requests for information from request module 340 within client software module 306. The request module 340 requests information, such as a block or collection of blocks stored on the server software module 304. The send/receive module 338 responds to such requests by supplying the requested block or collection of blocks to a receive/store module 342 shown in FIG. 3. Additionally, the request module 340, in one embodiment requests the shared context for a particular compressed block collection. The requested shared context typically relates to one or more blocks being simultaneously requested or blocks that will be requested at a later time.

In an alternative embodiment however, the shared context is supplied to the client software system 306 automatically upon an initial request for data. In one particular embodiment, the client software system 306 requests an executable application, i.e., an application that has been split and compressed as discussed above. In response to this request, the client software module 306 is provided a relatively small binary executable file, sometimes called a stubbed binary file, which is executed by the client software system. The stubbed binary file has relatively minimal functionality, but generally provides for the initiation of the executable application. As more functionality is required, the stubbed binary calls, to the server system, for one or more blocks of data, capable of performing the requested functionality.

Upon receipt, receive/store module 342 stores the received block or collection of blocks in memory 344. The memory 344 is generally part of the client system, such as system 112 shown in FIG. 1. Once the compressed block collection and/or shared context is stored in memory, decompress module 346 may access the collection or shared context through access module 348. Decompress module 346 decompresses one or more blocks of the collection, such as collection 312, using the shared context, such as context 314. Additionally, following decompression of a block, execute module 350 may execute or use the decompressed data stream. In using the decompressed data stream an input/output control module 352 may be used.

In an embodiment the decompress module 346 may decompress one block at a time. In other embodiments, the decompress module 346 may decompress two or more blocks at a time, using the same shared context. Further, decompression of blocks within a collection may be performed in any order, such that the no block is dependent on the decompression of another block in order to be decompressed and used.

Figure 4:
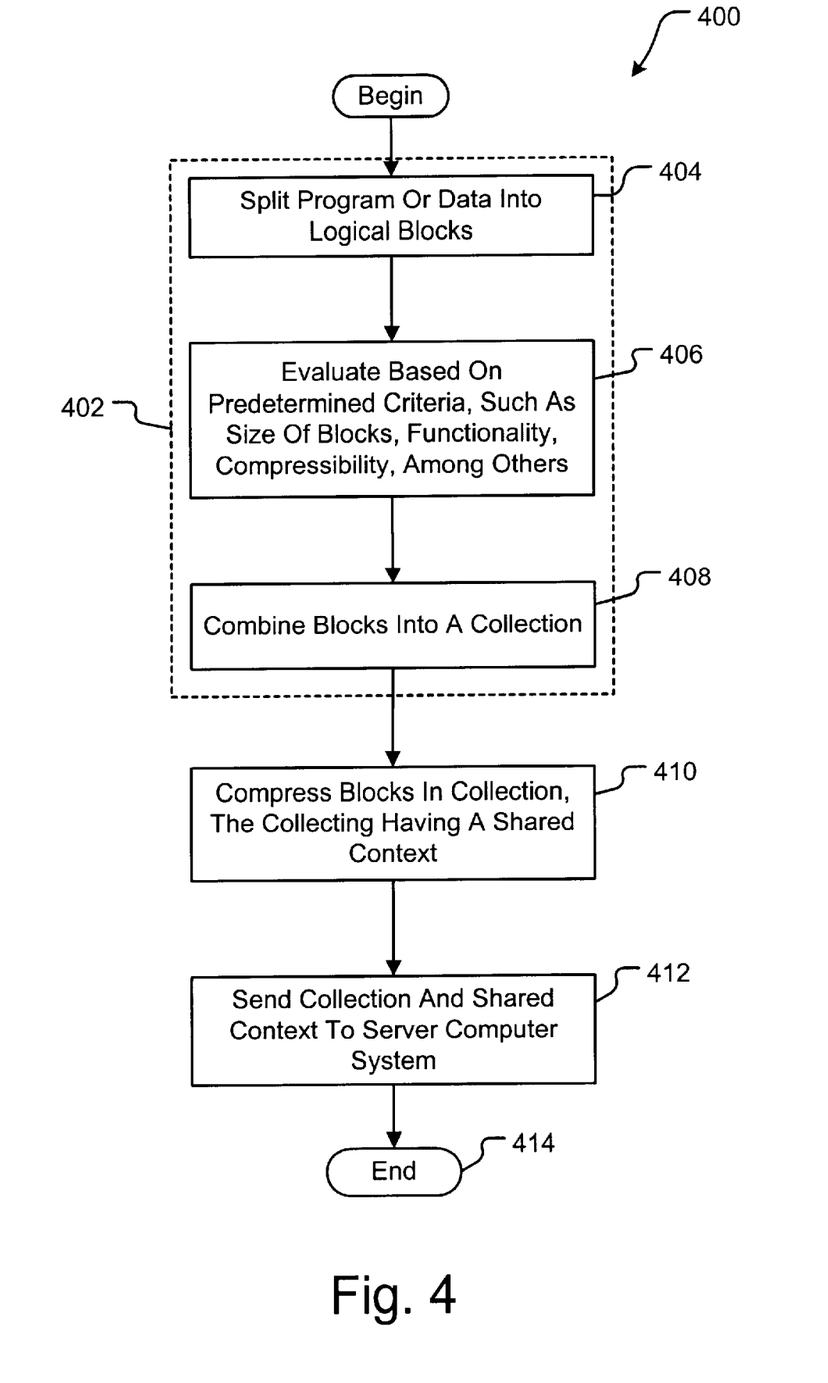
FIG. 4 illustrates a high-level flow chart of functional operations related to the compression of data according to aspects of the present invention.

FIG. 4 illustrates the functional components related to the compression of independent blocks within a collection according to aspects of the present invention. Prior to beginning the compression phase, the process 400 generally begins with a preparation phase 402, which divides data into logical blocks and creates a collection of these blocks to be compressed. The preparation phase 402 begins with split operation 404, which splits the uncompressed data into multiple blocks or objects. Split operation 404 may partition the entire uncompressed data file into blocks, wherein each block comprises code and/or data. In one embodiment, the uncompressed data file may contain profile information that may provide hints in separating the file into blocks. In alternative embodiments, split operation 404 must determine how to split the data into blocks, using size, functionality or some other predetermined criteria. When the uncompressed data relates to an application, the blocks may relate to subroutines of that application.

Upon splitting the file into multiple blocks, evaluate operation 406 evaluates the blocks based on a predetermined criteria, such as functionality, compressibility, or others. For instance, in one embodiment, evaluate operation 406 may determine which blocks operate in conjunction with other blocks based on flow of control issues, parameter passing algorithms or others. In an embodiment, the uncompressed data file may include profile information that indicates which blocks have strong affinities with other blocks. In another embodiment, the evaluate operation may compare blocks to each other in order to determine which combinations of blocks will produce high compression ratios, while maintaining some block affinity correlation.

Based on the evaluation operation 406, combine operation 408 combines different blocks into collections. In an embodiment, each collection of blocks has a unique set of blocks such that no two collections share any one block. Stated another way, each block belongs to only one collection. Alternative embodiments may associate a block with two or more collections. In such a case, the copies of the shared block may be created such that each collection may be represented by an independent data steam. In a particular embodiment, each collection of blocks relates to a funclet. More details on splitting, evaluating and combining into funclets, i.e., preparation operation 402, with respect to a particular embodiment can be found in U.S. patent application Ser. No. 10/146,638, entitled BINARY PREPARATION OF A PROGRAM FOR OPERATION IN AN ENVIRONMENT FOR SOFTWARE ON DEMAND APPLICATION (LOADER.NET), incorporated herein by reference for all that it discloses and teaches, filed concurrently herewith, and assigned to the Assignee of the present application.

Once prepared, compress operation 410 compresses each collection of blocks data stream. The compression process is described in more detail below in conjunction with FIG. 5. In general compress operation 410 evaluates each block collection and creates a unique context for each collection. Once created, compress operation compresses the collection based on the unique context. The unique context for each collection is "shared" by the blocks of the collection. Hence, each collection-specific context is referred to as a shared context.

Upon compressing the various collections of blocks, send operation 412 sends the collections, and their respective shared contexts to a server computer system. Alternative embodiments do not send the compressed collections to server computer systems, but instead may send compressed information directly to one or more client computer systems. Although send operation 412 is not necessary, such a transfer typically occurs to thereby exploit the benefits of the independent decompression characteristics of the blocks and corresponding collections. As discussed above, either the entire shared context, including compression and decompression information, or just the shared decompression context, having only decompression information, is sent to the client system.

Figure 5:
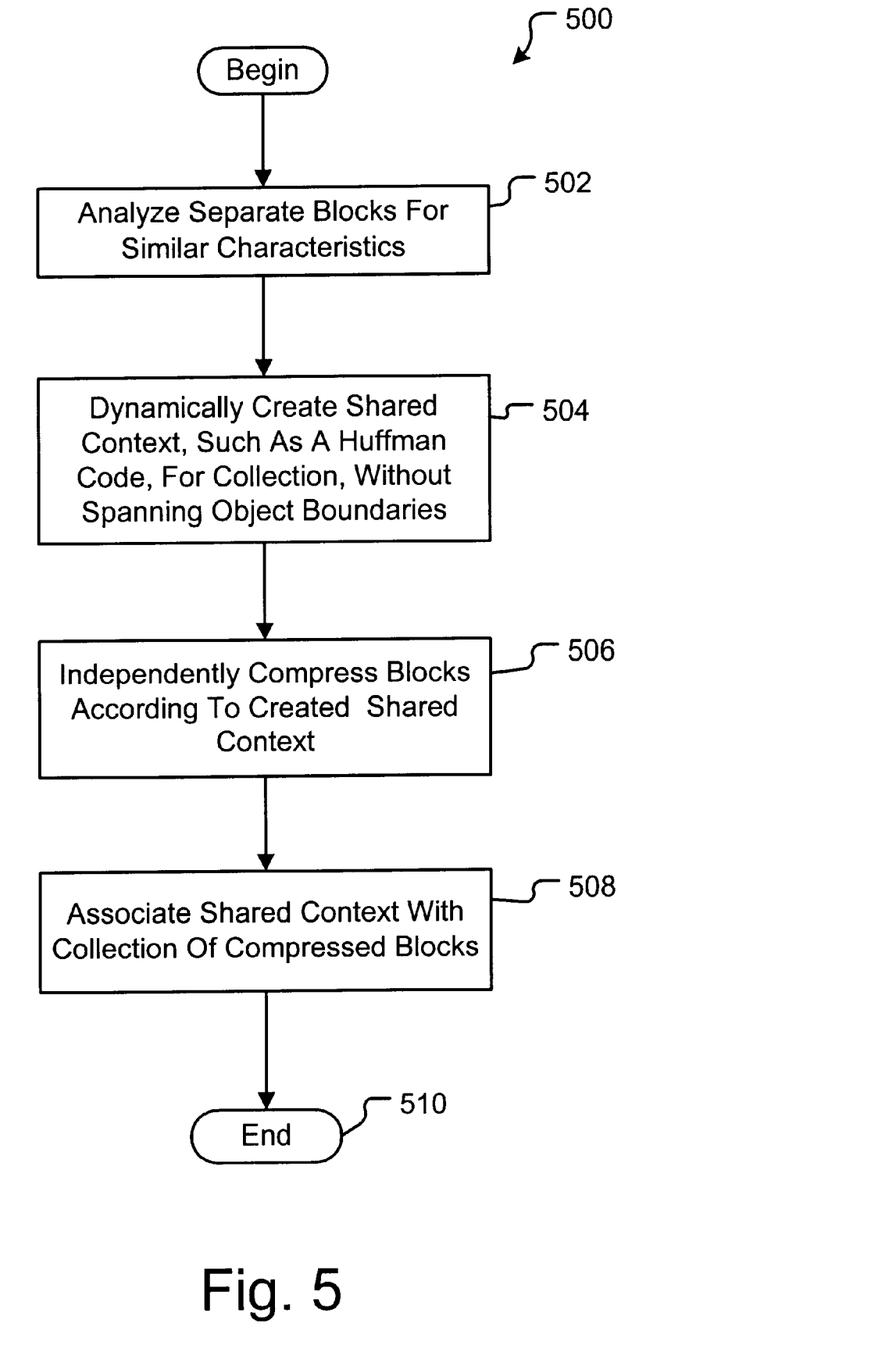
FIG. 5 illustrates a more detailed flow chart of operational characteristics of the present invention with respect to compressing data.

FIG. 5 illustrates the functional components related to details of the compression of independent blocks within a collection according to aspects of the present invention. As stated above in conjunction with FIG. 4, a compression module, such as compression module 308 shown in FIG. 3, may perform the compression, e.g., compression flow 500. The process 500 generally begins as the compression module receives a set or collection of uncompressed blocks. Upon receipt, analyze operation 502 analyzes the separate blocks for similar characteristics. For instance, analyze operation 502 may search for and locate redundant symbols or phrases of symbols across the various blocks. Such similar characteristics may be used in compressing the blocks. In a particular embodiment, an LZ-77 style compressor is used to compute shared contexts during the initial pass (operation 502) over all the blocks in the collection to compute symbol distributions and common multi-byte sequences.

Following analyze operation 502, create operation 504 creates a shared context for the collection of blocks based on the analysis performed in operation 502. The shared context relates to the variable-length codes used to replace redundant occurrences of symbols or phrases. The shared context is a dynamically created set of compression information based on the specific probabilities of symbol or phrase occurrence in the specific collection of blocks. In this case, dynamic creation of the shared context relates to the creation of a context based on an actual set of data and not based not a generic set of data not necessarily included in the collection of blocks currently be compressed. In an embodiment, the shared context is a Huffman tree. In another embodiment the shared context is a Huffman tree incorporating aspects of LZ-77 compression. In alternative embodiments, the shared context relates to other compression coding techniques.

Although create operation 504 creates a shared context based on the collection as a whole, create operation 504 is limited to the extent that the shared context must take into account that each block may be separately decompressed. Therefore, compression techniques that utilize pointers to repeated phrases cannot point to symbols or phrases spanning block boundaries. Such a pointer would violate the independently decompressible properties of the blocks. Hence, each shared context must account for block independence and limit the use of pointers or other compression steps that would prevent a singular block from being decompressible independent from other blocks.

In order to achieve independent decompressibility, the next operation, compress operation 506 compresses each block, using the determined shared context, such that each block may be decompressed independently of the others. Compressing the blocks of a collection in this manner generally requires that pointers do not cross block boundaries. Actual compression techniques may vary, but the use of the shared context during the compression of each block in a collection results in a compressed block collection having independently decompressible blocks, wherein each block of the collection may be decompressed using the shared context for that block. Although an embodiment requires upper levels of software to ensure that blocks are correctly associated with a shared context, an alternative embodiment may add specific bits or codes to the front of each block to associate it with a collection and hence, a shared context during compression operation 506.

To illustrate the general compression process of operation process consider the following example, shown in Table 1, where three different sentences of English text can be compressed using a shared context such that they can be independently decompressed.

TABLE 1

Example Compression Creating Shared Context

| | |
|---|---|
| Three example sentences: | 1. See Spot run<br>2. See Spot run fast<br>3. See Jane chase Spot |
| Shared context: | Symbol#1: "See"<br>Symbol#2: "Spot"<br>Symbol#3: "run" |
| Example Huffman Encoding: | Symbol#1: "00" (short code due to 4 total occurrences)<br>Symbol#2: "01" (short code due to 4 total occurrences)<br><a>: "1000" (medium code due to 3 total occurrences)<br><e>: "1001" (medium code due to 2 total occurrences)<br><s>: "1010" (medium code due to 2 total occurrences)<br>Symbol#3:<br>"1011" (medium code due to 2 total occurrences)<br><f>: "11000" (longer code due to 1 total occurrence)<br><t>: "11001" (longer code due to 1 total occurrence)<br><J>: "11010" (longer code due to 1 total occurrence)<br><n>: "11011" (longer code due to 1 total occurrence)<br><c>: "11100" (longer code due to 1 total occurrence)<br><h>: "11101" (longer code due to 1 total occurrence) |
| Compressed Token Sequences: | Sentence#1: <Symbol#1><Symbol#2><br>Sentence#2: <Symbol#1><Symbol#2><Symbol#3><br>Sentence#3:<br><Symbol#1><Symbol#2><Symbol#3><f><a><s><t><br>Sentence#4: <Symbol#1><br><J><a><n><e><c><h><a><s><e><Symbol#2> |
| Compressed Bit Version | Sentence#1: 00 01 (less than one byte)<br>Sentence#2: 00 01 1011 (one byte)<br>Sentence#3:<br>00 01 1011 11000 1000 1010 11001 (less than 4 bytes)<br>Sentence#4:<br>00 11010 1000 11011 1001 11100 11101 1000 1010 1001 01 (less than 5 bytes) |

With reference to Table 1, three example English language sentences are shown in the first row. These sentences may be compressed according to the process operation 502, 504 and 506. Ignoring the spaces in the sentences, the shared context for the example may include symbols for "See", "Spot", and "run" since they are sequences used frequently by different blocks, wherein each block is one sentence. In other words, analyze operation 502 analyzes these different blocks for such repeated patterns. Next, create operation 504 creates a shared context for the three blocks, shown in the second row of Table 1. Further, a Huffman table can be created, such as the hypothetical one shown in the third row. The Huffman table represents the common symbols along with single English letters. As such, the shared decompression context consists of the common symbols and the Huffman decode table.

Next, compress operation 506 compresses the sentences. The fourth row of Table 1 indicates the compressed token sequences for each of the sample sentences as compressed according the present invention. The actual compressed bit versions or representations for each of the sentences are shown in the fifth row of Table 1.

As shown in the above example, the blocks may be compressed as a collection, yet each block may be independently decompressed using a single decompression context.

Once the blocks are compressed, associate operation 508 associates the shared context with the collection of blocks. In one embodiment, each block has a relatively small portion of code identifying the collection and, hence the shared context. Other embodiments may associate the blocks directly with the shared context. The association provides a decompressor module, such as decompressor module 346 (FIG. 3) with adequate identification information to identify and use the proper shared context to decompress each block in the collection.

Figure 6:
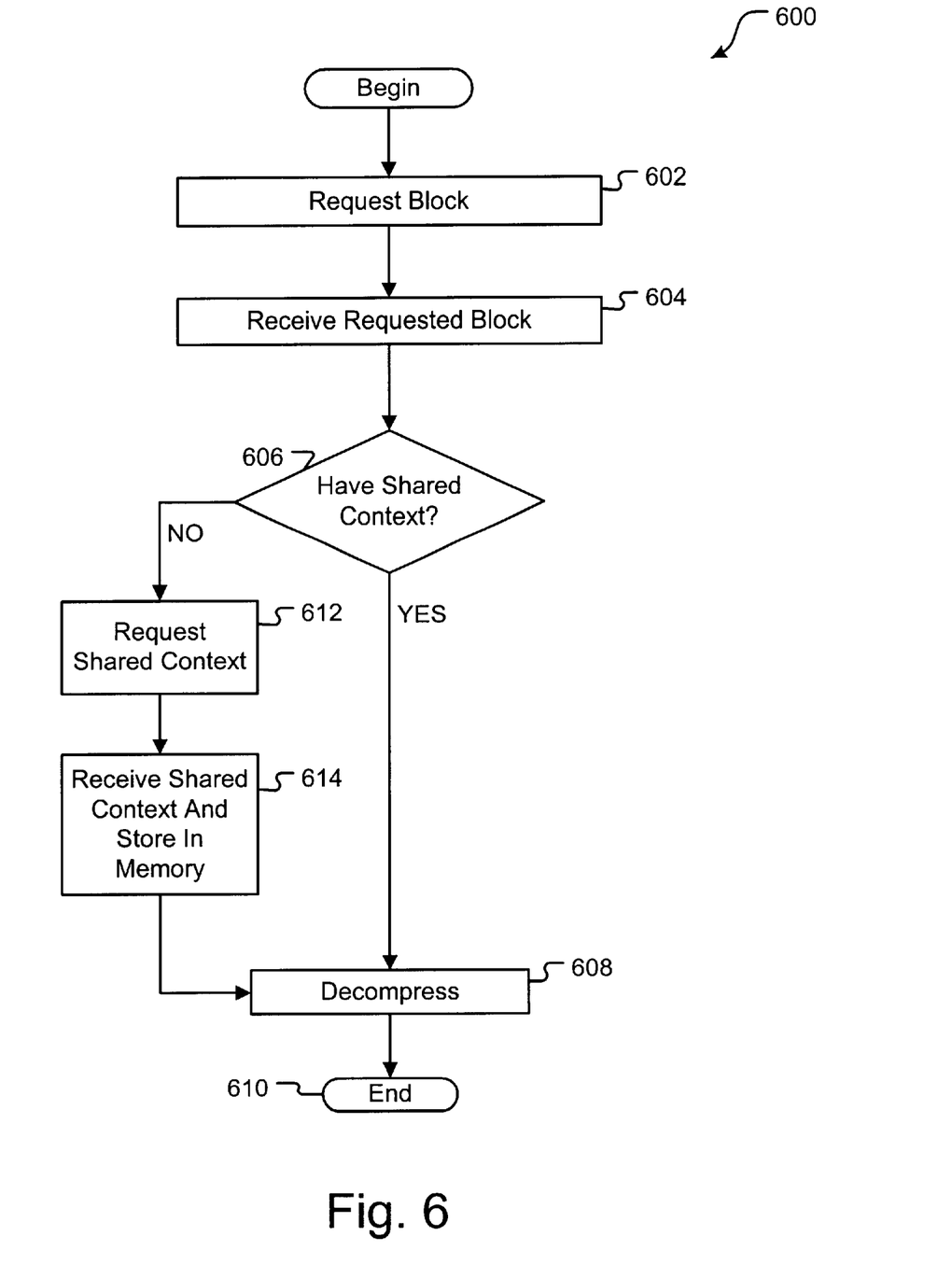
FIG. 6 illustrates a flow chart of operational characteristics relating to requesting, receiving and decompressing compressed data in accordance with an embodiment of the present invention.

FIG. 6 illustrates the functional components related to details of requesting and decompressing independent blocks within a collection. In accordance with aspects of the invention, a client computer system, such as system 112 (FIG. 1) may perform the functions shown and described in conjunction with FIG. 6.

The process 600 generally begins as request operation 602 requests a block. The request may be made by a client computer system operation requesting the transfer of a block from a server computer system as shown and described above in conjunction with FIG. 1. Alternatively, request operation 602 simply requests access to a compressed block from memory or from another operation. In response, receive operation 604 receives the requested block, wherein the block is compressed.

Upon receiving the compressed block, such as from the server computer system, detect operation 606 detects whether the shared context necessary for decompressing the block is resident in the decompression module. That is, the shared context may have been transferred with the block, or it may have been transferred with another block in the collection some time prior to the receipt of the current block.

If detect operation 606 detects that the decompressor module has the required shared context, flow branches YES to decompress operation 608. Decompress operation decompresses the block using the shared context. Decompression may use known decompression methods of parsing and decoding the stream of symbols and phrases. However, the shared context for the associated collection is used for this block, as can and should be used for other blocks of the same collection. Once decompressed, flow 600 ends at end operation 610.

If detect operation 606 determines that the decompressor module does not have the shared context for the received block, flow branches NO to request operation 612. Request operation 612 requests the shared context for the received block. In an embodiment, request operation relates to a communication between a client system, such as system 112 (FIG. 1) and a server computer system, such as system 110 (FIG. 1) requesting the download of the proper context. In response, receive operation 614 receives the shared context for the block.

Upon receiving the shared context, decompress operation 608 decompresses the block, as discussed above, and then flow 600 ends at end operation 610.

An implementation of the invention described above may be incorporated in a system wherein the client system, such as system 112 requests to execute a particular application. Initially, the application is downloaded to the client system from the sever computer system, such as system 110 (FIG. 1) in the form of a stubbed binary file. The stubbed binary file relates to a skeleton executable file having enough code to begin execution of the application. Upon user-initiated events and other application-initiated requests for other functionality, requests are made from the client system to the server system for one or more blocks. Since these blocks are requested on an "as-needed" basis, there is no predetermined order in which these blocks may be requested. However, since each block is independently decompressible, requests may be made in any order. More details on the architecture relating to executing an application in association with requesting and receiving functional components on demand with respect to a particular embodiment can be found in U.S. patent application Ser. No. 10/146,611, entitled AN ENVIRONMENT FOR SOFTWARE ON DEMAND APPLICATION (LOADER.NET), incorporated herein by reference for all that it discloses and teaches, filed concurrently herewith, and assigned to the Assignee of the present application.

In accordance with this particular embodiment, the shared contexts for the various compressed block collections may be supplied to the client system with the stubbed binary. Thus, detect operation 606 (FIG. 6) may simply evaluate the received block to determine which shared context to use. Alternatively however, the shared contexts may be supplied with the first block requested from a particular collection. In such a case, the server may keep track of requests vis a vis associated collections.

Implementing the above-described compression and decompression system and method provides many benefits. For example, the above principles allow for the creation of a customized context for relatively small blocks of data, yet the actual compression ratio is acceptable since the context may be shared by many blocks. That is, since many blocks share the same context, the overhead associated with creating and transferring the custom context is spread over several different blocks. Additionally, since the custom context was created dynamically, i.e., based on actual symbol distribution, the compression ratio is generally better than if a stock or general context were used. Moreover, in a specific embodiment, since the order of blocks downloaded is not known in advance, each block is separately callable and thus individually decompressible, independent of the other blocks in the collection. By separating the decompression context from the individual blocks, yet retaining the value of the context being specific to the collection, better compression ratios are achieved with little or no additional runtime cost. That is, reducing the number of bytes necessary to transmit over a communications connection, such as over an Internet connection, to execute a program or download data saves considerable time.

The above specification, examples and data provide a complete description of the manufacture and use of the composition of the invention. However, since many embodiments of the invention can be made without departing from the spirit and scope of the invention, the invention resides in the claims hereinafter appended.

What is claimed is:

1. A method of compressing a plurality of blocks of data, the method comprising:
    analyzing the plurality of blocks to determine unique characteristics common within the plurality of blocks;
    dynamically creating a shared decompression context for the plurality of blocks; and
    compressing the plurality of blocks according to the shared decompression context.

2. A method as defined in claim 1 wherein the unique characteristics of the blocks relate to probabilities of symbol occurrence.

3. A method as defined in claim 1 wherein the shared context is a Huffman tree.

4. A method as defined in claim 2 wherein the Huffman tree further comprises information related to literals and pointers.

5. A method as defined in claim 1 wherein the shared context is a variable-size code.

6. A method as defined in claim 1 wherein the blocks are combined into a collection and the shared context relates to the blocks of the collection; the method further comprising:
    associating the shared context with the collection of blocks and wherein the shared context may be transferred independently of the blocks.

7. A method as defined in claim 6 wherein each block may be individually decompressed.

8. A method as defined in claim 7 wherein the shared context comprises unique characteristics based on the collection of blocks.

9. A computer program product having computer-executable instructions for performing the steps recited in claim 8.

10. A computer program product having computer-executable instructions for performing the steps recited in claim 1.

11. A method of decompressing compressed data, the method comprising:
    accessing a block of compressed data, wherein the block of data is associated with one or more other blocks of data;
    accessing a shared context, the shared context comprising decompression information for the block of compressed data as well as one or more other blocks of data; and
    decompressing the block using the shared context.

12. A method as defined in claim 11 further comprising decompressing a second block of compressed data using the shared context.

13. A method as defined in claim 12 wherein the decompression occurs on client computer system, remote from a server computer system and wherein the shared context is transferred to the client computer system independently of the blocks of data.

14. A method as defined in claim 13 wherein the blocks of data are independently decompressed.

15. A computer program product having computer-executable instructions for performing the steps recited in claim 14.

16. A computer program product having computer-executable instructions for performing the steps recited in claim 11.

17. A computer system for compressing a set of uncompressed data blocks, the system comprising:
    a receive module for receiving the set of uncompressed data blocks; and
    a compression module for compressing the set of uncompressed data blocks, wherein the compression module further comprises:
        an analysis module that analyzes the blocks for compression characteristics and dynamically creates a shared context; and
        a build module for compressing the blocks, the build module compressing the blocks, the build module using the shared context to compress the blocks.

18. A computer system as defined in claim 17 further comprising a send module for sending information to a second computer system, the send module sending the shared context to the second computer system, the send module also sending one of the plurality of compressed blocks of a data to the second computer system.

19. A computer system as defined in claim 18 wherein the second computer system decompresses the one block of compressed data independently of the other blocks in the collection.

* * * * *

UNITED STATES PATENT AND TRADEMARK OFFICE
CERTIFICATE OF CORRECTION

PATENT NO.   : 6,700,513 B2                                          Page 1 of 1
DATED        : March 2, 2004
INVENTOR(S)  : Thomas Dee McGuire It is certified that error appears in the above-identified patent and that said Letters Patent is hereby corrected as shown below:

<u>Column 9,</u>
Line 50, delete "10/146,638" and replace with -- 10/146,635 --

Signed and Sealed this

Twenty-fifth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO.     : 6,700,513 B2
DATED          : March 2, 2004
INVENTOR(S)    : Thomas Dee McGuire It is certified that error appears in the above-identified patent and that said Letters Patent is hereby corrected as shown below:

Drawings,
Fig. 3, reads "Ucompressed" should read -- Uncompressed --

Column 9,
Line 45, delete "steam" and replace with -- stream --

Column 12,
Line 59, delete "sever" and replace with -- server --

Signed and Sealed this

Third Day of August, 2004

JON W. DUDAS
*Acting Director of the United States Patent and Trademark Office*